US005082595A

United States Patent [19]

Glackin

[11] Patent Number: 5,082,595
[45] Date of Patent: Jan. 21, 1992

[54] METHOD OF MAKING AN ELECTRICALLY CONDUCTIVE PRESSURE SENSITIVE ADHESIVE

[75] Inventor: Richard T. Glackin, Spring Grove, Pa.

[73] Assignee: Adhesives Research, Inc., Glen Rock, Pa.

[21] Appl. No.: 472,950

[22] Filed: Jan. 31, 1990

[51] Int. Cl.⁵ .............................................. H01B 1/24
[52] U.S. Cl. .................................. 252/511; 252/510; 524/495; 524/496
[58] Field of Search ................ 252/511, 510; 524/495, 524/496

[56] References Cited

U.S. PATENT DOCUMENTS

| | | |
|---|---|---|
| 2,670,306 | 2/1954 | Folwell . |
| 2,808,352 | 10/1957 | Coleman et al. . |
| 3,475,213 | 10/1969 | Stow . |
| 3,778,306 | 12/1973 | Stow . |
| 4,547,311 | 10/1985 | Sako et al. ........................... 252/511 |
| 4,548,862 | 10/1985 | Hartman ............................. 428/323 |
| 4,588,762 | 5/1986 | Mruk et al. .......................... 252/511 |
| 4,755,659 | 7/1988 | Leon et al. ............................. 428/38 |
| 4,772,422 | 9/1988 | Hijikata et al. ...................... 252/511 |
| 4,820,446 | 4/1989 | Prud'Homme ...................... 252/511 |
| 4,874,549 | 10/1989 | Michalchik .......................... 252/511 |

Primary Examiner—Josephine Barr
Assistant Examiner—Bradley A. Swope

[57] ABSTRACT

An electrically conductive pressure sensitive adhesive is provided which is prepared by incorporating a conductive black filler into a pressure sensitive adhesive in such a manner as to impart electrical conductivity at a carbon concentration low enough to avoid adversely affecting the physical properties (such as tack) of the adhesive. By practice of the present invention, the carbon particles present in the adhesive are in the form of a carbon structure which optimizes the efficient employment of carbon by providing conductive pathways through the adhesive.

8 Claims, 6 Drawing Sheets

METHOD OF MAKING AN ELECTRICALLY CONDUCTIVE PRESSURE SENSITIVE ADHESIVE

BACKGROUND OF THE PRESENT INVENTION

In the past, the practical use of adhesives with electrical conductivity has been limited to non-pressure sensitive adhesives. Generally, the conductive fillers used to impart conductivity are impractical for most adhesive-based applications either because they are prohibitively expensive (such as gold and silver) or they possess oil absorption characteristics that adversely affect the physical properties of the pressure-sensitive adhesive (PSA).

It is known to add conductive blacks (i.e., carbon) to normally non-conductive PSA's, with the electrical properties of the PSA improving with the degree of carbon loading. See, for example, U.S. Pat. No. 3,778,306 which provides for the presence of between about 20-43 percent by weight of carbon in a pressure sensitive adhesive. However, at loadings high enough to provide good conductivity, a reduction in physical performance of the PSA characteristically results, affecting physical properties such as tack, peel, and shear. In the PSA formulation disclosed in the patent, loss of tack due to the presence of large amounts of conductive carbon is compensated for by the addition of a tackifying or plasticizing agent to the formulation and milling the rubber to effect softness.

Loss of adhesive tack is also recognized as a potential problem with respect to electrically-conductive pressure sensitive adhesives in U.S. Pat. No. 2,670,306. In this patent, the use of powdered graphite is stated to be preferred over carbon black to minimize the degree of tack loss.

U.S. Pat. No. 3,475,213 discloses an electrically-conductive adhesive tape which comprises a pressure sensitive adhesive and electrically-conductive particles distributed as a monolayer in the adhesive layer. The particles are stated to have a thickness slightly less than the thickness of the adhesive layer. The patent states that such adhesive tapes exhibit electrical resistances less than 100 ohm/square inch.

Various methods are known to impart conductivity to adhesives. U.S. Pat. No. 2,808,352 discloses an electrically conductive adhesive tape wherein the adhesive base is impregnated with finely divided silver particles. U.S. Pat. No. 4,367,745 discloses a conformable electrically conductive composition composed of a plurality of deformable, non-polar microspheres around which are dispersed electrically conductive particles.

U.S. Pat. No. 4,547,311 discloses an electrically-conductive polymeric coating composition comprising a dispersion of carbon black in an organic solvent and a solution of a polymer in an organic solvent. The coating composition may be used to form coatings of low resistivity. Fluoroelastomers, urethane elastomers and vinylidene fluoride/tetrafluoroethylene polymers are disclosed as exemplary polymers forming the coating composition. Pressure sensitive adhesive compositions are not disclosed.

The '311 patent requires that the dispersion of carbon black in the solvent exhibit a viscosity in the range of 100 to 5000 cp, with the patent examples indicating that significant ball milling of the dispersion is required to achieve this result.

While ball milling pigment in a solvent vehicle is a well-known method of improving particle dispersion, it is believed that such ball milling is detrimental to the inherent chain-forming structure of the carbon black. While the patent examples indicate that an electrically conductive film is successfully produced, the resulting electrical properties are believed to be the inherent result of the presence of carbon black in an amounts of 40 and 60 percent by weight based on the weight of the carbon black and the polymer matrix.

U.S. Pat. No. 4,548,862 is directed to a flexible tape having bridges of electrically conductive particles extending through the adhesive layer. The particles have ferromagnetic cores which by magnetic attraction can serve to form the requisite bridges.

U.S. Pat. No. 4,588,762 discloses a pressure sensitive adhesive composition consisting of both a viscoelastic polymeric adhesive phase and an electrically conductive aqueous phase containing a water receptive polymer, a humectant, and an electrolyte.

However, to date no one has provided a pressure-sensitive adhesive composition which exhibits desirable electrical properties (such as high conductivity) by inclusion of conductive carbon black while minimizing the effect of such filler on the adhesive properties of the composition. The prior art to date has also failed to provide a pressure sensitive adhesive composition exhibiting electrical properties which can be easily tailored to a desired end use ranging from static protection to serving as an electrical conductor between electrode surfaces.

The prior art has also failed to provide a conductive pressure sensitive adhesive wherein the conductive carbon black is present in a form which optimizes its ability to enhance the electrical properties of the adhesive.

OBJECTS AND SUMMARY OF THE PRESENT INVENTION

An object of the present invention is thus to provide a pressure sensitive adhesive formulation which exhibits commercially useful electrical properties at low carbon loadings without the usual tradeoff in physical properties (such as loss in tack).

In accordance with the present invention, there is thus provided a method for the production of an electrically conductive pressure sensitive adhesive composition comprised of a pressure sensitive adhesive and a conductive carbon black dispersed in said adhesive, said method comprising the steps of forming a slurry of said conductive carbon black in an organic solvent compatible with said adhesive under mild agitation or stirring and in the absence of high shear to preserve the structure of the carbon black and to achieve uniform wetting of said conductive carbon black resulting in a homogeneous slurry, and combining said slurry with said adhesive to form an admixture of said conductive carbon black, said solvent and said adhesive, and separating said organic solvent from said admixture of said carbon and said adhesive to yield a dry conductive pressure sensitive adhesive composition.

In accordance with another embodiment of the present invention, there is also provided a conductive pressure sensitive adhesive composition prepared by the above method.

In accordance with the present invention, there is also provided a conductive pressure sensitive adhesive containing a conductive carbon black wherein said carbon black is present in an amount of less than 20 percent by weight and has a carbon structure inherent to the chain-forming characteristic of conductive carbon black.

DETAILED DESCRIPTION OF THE PRESENT INVENTION

Figure 1:
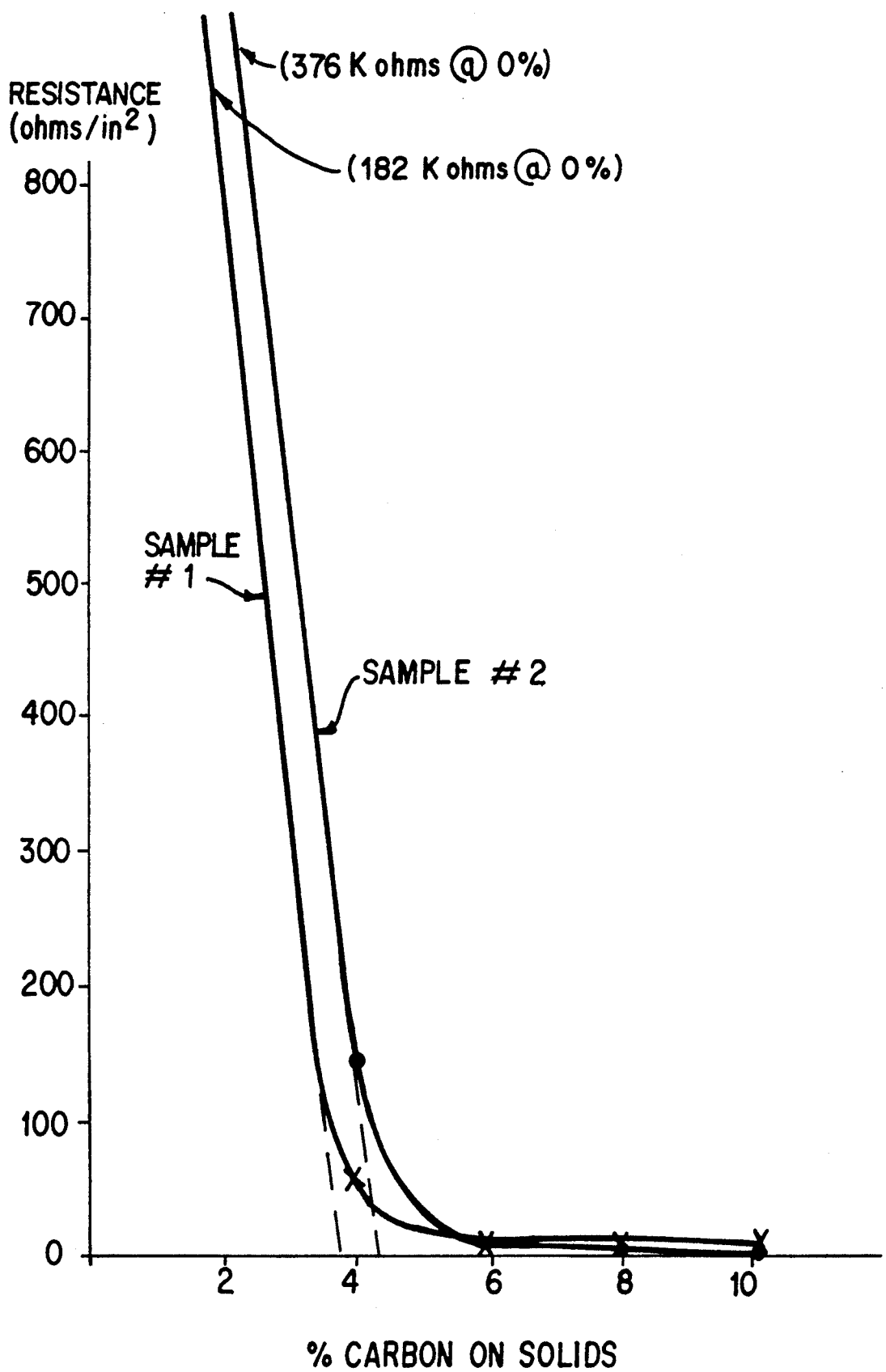
FIG. 1 is a graphical depiction of electrical resistance (ohms) vs. percent carbon loading in a polar base PSA showing typical critical concentration of conductive carbon in the present invention.

The present invention is directed to an electrically-conductive pressure sensitive adhesive (PSA) which retains its adhesive properties subsequent to the incorporation of an electrically-conductive filler in the PSA.

A pressure sensitive adhesive has been defined as a viscoelastic material which in solvent-free (or dry) form remains permanently tacky.

Pressure-sensitive adhesives have many formulations but generally are acrylic-based, natural rubber-based or styrene-butadiene rubber-based elastomers (i.e., random or block copolymers of styrene with isoprene or butadiene). Silicon-based adhesives are also suitable as are butyl elastomers.

Various components can be employed to formulate the PSA including but not limited to elastomers, tackifiers, plasticizers, fillers and/or antioxidants. The performance of the PSA is generally dependent upon the properties of tack (instantaneous adhesiveness), adhesive strength and cohesive (or internal) strength. A discussion of exemplary PSA's and formulations thereof resides in U.S. Pat. No. 3,778,306, herein incorporated by reference.

PSA's are normally coated onto release paper during the manufacturing process to protect the adhesive during storage and prior to use of same.

The present invention, rather than compensating for the problem of tack loss, etc. resulting from the addition of a conductive carbon black to a pressure sensitive adhesive composition, eliminates the loss of tack by using carbon black in a much more efficient manner whereby desirable electrical properties are achieved at carbon loading levels below 20 percent by weight based on the total dry weight of the adhesive composition.

The utility of the present invention is demonstrated by the formulation of a wide variety of electrically conductive pressure sensitive adhesive compositions including, but not limited to, acrylic, rubber-resin, polar and silicone-based adhesives.

It is imperative that for a conductive adhesive to be commercially useful, it must possess more than a nominal adhesive performance. Most applications for electrically conductive PSA's are in technical fields capitalizing on state of the art technologies. Such technologies typically call for high performance adhesives which posses high bond strength, good performance over a wide temperature range, resistance to moisture, close dimensional tolerances etc. By practice of the present invention, high performance PSA's can be provided which also exhibit desirable electrical properties.

The electrical properties of the PSA compositions of the present invention are enhanced by the presence of a conductive carbon filler which is present in the form of a conductive network within the adhesive composition.

Exemplary conductive blacks which may be used in the practice of the present invention include, but are not limited to, Chevron Acetylene Black, and Cabot XC-72. Other types of conductive blacks may be used. However, the form of the carbon "as supplied" may affect, but not prevent, the achievement of good dispersion. An example is Cabot Black Pearls, supplied in pellet form. By way of definition, grades of carbon black where the dispersed particles tend to orient into chains of particles are referred to as conductive carbon black.

The physical form of carbon black, as supplied, is typically a black powder consisting of agglomerates of discrete carbon particles having a size on the order of 20 to 30 nanometers. These agglomerates must be broken down to permit adequate dispersion of the individual carbon particles within the adhesive composition. In order to enhance the formation of conductive pathways, certain grades of carbon are preferably employed which have the characteristic of forming conducting chains of carbon particles when properly dispersed within the adhesive composition (i.e., conductive blacks).

The study of particle loading in plastics to achieve conductivity is well documented in the literature, and includes studies in thermal as well as electrical conductivity. Extensive studies have been done to optimize random particle distribution to achieve conductivity in essentially non-conducting polymers. As the concentration of the conductive filler is increased, the average distance between particles naturally decreases. At low concentrations, the distances between particles is very large and virtually no flow of electrons occurs when an electrical potential is applied to the composition. As the filler concentration increases, the particles become closer until electrons can "jump the gap" between particles. At this point, a dramatic change occurs in the effect of filler loading on the electrical resistance exhibited by the composition. That is, further increases in filler concentration do not substantially affect the resistance of the composition as the "critical concentration" of the filler within the concentration has been reached.

With essentially random particle distribution, very high loadings are necessary to exceed the critical concentration while achieving adequate conductivity. At the filler concentrations conventionally required to achieve the critical concentration, functional pressure sensitivity is lost or, at best, the physical performance of the PSA is sacrificed. As earlier described, the loss of tack in the PSA of U.S. Pat. No. 3,778,306 is compensated for by the addition of a tackifier when amounts of a conductive filler of between 20-43 weight were employed.

U.S. Pat. No. 3,778,306 teaches that the adhesive composition is formed by combining the adhesive with a conductive black filler in a mixer, with the filler being added to the adhesive in a dry form. The patent fails to provide a conductive PSA which exhibits desirable electrical properties without the presence of large amounts of filler (while reducing the effective particle distance over localized areas).

In the present invention, the effective particle distance required to achieve conductivity is reduced by modifying the method by which conductive blacks are incorporated into PSA's as well as optimizing the manner by which the conductive black can enhance the conductivity of the adhesive. As a result, a shift in the expected critical concentration for the system unexpectedly occurs. The critical concentration which results is achieved with use of substantially smaller amounts of conductive carbon than has previously been possible to provide a conductive PSA while still retaining the original physical properties (such as tack) of the PSA. For instance, amounts of conductive carbon of less than 20 percent by weight based on the dry weight of the PSA (and sometimes as low as 5 percent) can be employed while still attaining desirable electrical properties.

The critical concentration of such PSA's can be reduced to about 5 percent by weight conductive black based on adhesive solids using a variety of PSA compositions (e.g., polar, acrylic, silicone, or rubber based).

It has thus been surprisingly found that the conductive carbon black may be dispersed within the PSA composition in a manner which enhances the formulation of conductive pathways through the composition and enables the critical concentration of the conductive carbon black to be advantageously reduced to less than 20 percent by weight. That is, the ability of the conductive carbon to form a chain-like structure is retained upon being dispersed in the PSA.

As depicted by FIG. 1, the critical concentration of carbon black in a polar based PSA is shown to be approximately 4 percent by weight, with any additional amount of carbon black in the composition failing to further significantly reduce the resistance of the composition. Such a result is in stark contrast to the typical critical concentration curves of the prior art (which prior art demonstrate that high conductivity occurs at a particle concentration at or above about 60 percent by weight).

The results of FIG. 1 are believed to substantially conform to those results that would be obtained with other types of PSA's in view of the electrical properties observed in relation to the amount of carbon filler present.

A conductive PSA formulated by the following method very advantageously and quite surprisingly exhibits highly desirable electrical properties while retaining the physical properties normally associated with the PSA. Of course, the extent and degree of electrical properties exhibited by the PSA will depend to a certain extent upon the amount of conductive carbon filler added to the PSA as discussed further below.

The formulation technique employed broadly consists of mixing the conductive carbon with an organic solvent to form a slurry followed by the addition of the pressure sensitive adhesive to the slurry. Once the solvent is removed, a conductive PSA remains.

The identity of the solvent is not critical as a number of different organic solvents may be successfully employed including but not limited to methyl ethyl ketone, toluene, acetone, ethyl acetate, etc. The organic solvent employed is preferably compatible with the PSA employed.

The relative proportions of conductive black and organic solvent employed to form the slurry of the two components are not critical. For instance, the slurry may be comprised of the organic solvent and conductive black in weight ratios from about 10:1 to 100:1, and preferably from about 15:1 to 20:1.

Good results may also be obtained with a series of dilutions of the carbon black in the solvent, with a heavy paste initially being formed and, ultimately, a loose pourable slurry resulting. During the formation of the slurry, agitation (e.g. stirring) is preferably used to ensure good wetting and homogeneity of the mixture. Forceful agitation that would effect shearing is to be avoided as high shear is believed to destroy the chain-forming ability of the conductive carbon black inherent to same. On a lab scale, stirring with a glass rod in a 500 ml. beaker has proven successful, although stirring with mild mechanical agitation is more practical and efficient. The slurry need only be agitated or admixed sufficiently to permit the carbon black particles to orient and/or align themselves, which orientation and/or alignment will result in the formation of conductive pathways in the resulting PSA.

Once formed, the slurry can be combined with the adhesive in any manner which permits a substantially homogeneous admixture of the two to result. Frequently, the PSA will be supplied in the form of a solution of polymer (PSA) solids in an organic solvent. This, of course, enhances the homogeneous admixture of the two compositions. In such an instance, the respective organic solvents may be the same or different but in either instance should be sufficiently compatible to permit the formation of the homogeneous admixture.

Of particular interest is that, during the formation of the slurry, a thickening of the slurry can be observed. It is believed that the thickening indicates the breakdown of carbon agglomerates and orientation of discreet carbon particles into conductive chains or filaments of carbon. Such thickening is evidenced by a viscosity increase in the slurry apart from that which would normally be encountered as a result of the formation of the slurry. Hence, a predisposition for the formation of conductive pathways in the PSA is established even before combining the carbon with the adhesive.

Once formed, the admixture of the conductive black, solvent and PSA may be layered on a surface and the solvent(s) present removed by conventional means including application of heat or ambient volatilization of the solvent. Upon removal of the solvent(s), a conductive PSA composition results which exhibits desirable electrical properties without adversely affecting the physical properties of the PSA.

The amount of conductive carbon black combined with the PSA will vary depending upon the end use contemplated for the PSA and the type of electrical properties desired. Obviously, the electrical conductivity of the PSA will increase in relation to carbon loading. However, even the presence of minor amounts (less than about 3-5 percent by weight) of carbon in the PSA of the present invention will enable sufficient conductivity to be achieved for certain end uses.

It is also contemplated that other types of fillers or additives may be present in the conductive PSA compositions of the present invention. For instance, it may be desirable to incorporate conductive fibrous filler such a metallic-coated fibers to further enhance the electrical properties of the PSA.

The conductive PSA composition of the present invention may take many forms. For instance, the PSA may be employed in the form of a tape or label by application of the PSA composition to a suitable backing material. The composition may also be used as a double sided adhesive film per se without backing material. PSA tapes are conventionally offered with a variety of backing materials such as aluminum or copper foils, fabric, cellophane, cellulose acetate, polyester film, polyethylene, polypropylene, plasticized polyvinyl chloride, etc. Double faced PSA films are also known which employ a removable release sheet instead of a backing material.

The manner by which such tapes can be formed is well-known and generally involves the steps of coating, drying and laminating.

A lengthy discussion of PSA tapes and labels and the various ingredients which can conventionally be employed in such formulations resides in Skeist, *Handbook of Adhesives*, 2nd edition, 1977, pages 724–735, herein incorporated by reference.

The adhesive composition of the present invention readily lends itself to the formulation of a variety of PSA compositions which may be adopted for use in varied end uses in the electronics industry. By way of background, in this industry a composition which exhibits a resistance of between $10^4$ to $10^{12}$ ohms/square inch is considered to be static dissipative, and a resistance in excess of $10^{12}$ is considered to be indicative of an insulative material.

EXAMPLE 1

In a beaker, 2.28 grams of acetylene black (obtained from Chevron Company as 50% compressed carbon black), are wetted with 8.28 grams of toluene. The resulting heavy dispersion is stirred with a glass rod to insure good wetting and uniformity. Within one or two minutes, solvent absorption by the carbon yields a stiff paste that becomes dry enough to cake.

Another 8.28 grams of toluene are added. Initially, this produces a stirrable dispersion that quickly thickens to a heavy paste.

A third addition of solvent consists of 16.56 grams of toluene. Stirring for an additional five minutes produces a pourable thixotropic slurry having a cement-like consistency. The high degree of thixotropy makes it impractical to measure the viscosity of the slurry by conventional means such as by Brookfield or rotating cylinder. The carbon-solvent slurry is now ready for addition of a PSA adhesive.

The adhesive base comprises a commercially available pressure sensitive acrylic resin available from Ashland Chemical Company under the tradename Ashland A-1081 supplied as a 45% solids polymer solution. 57.97 grams of A-1081 are cut with 6.63 grams of toluene. This reduces the viscosity, which improves blending as well as subsequent coating.

32.3 grams (or half of the adhesive) are added to the carbon slurry. The mixture is blended by stirring until rendered homogeneous. Finally, the remaining 32.3 grams of adhesive are added and stirred until uniform homogeneity is obtained.

Subsequently, the adhesive is cast in the form of a thin film by draw down and oven drying at a temperature of 150° to 250° F. to evaporate the solvent, thus yielding an adhesive layer.

The polar adhesive in Table I was prepared in the same manner as Example #1, but using acetone in place of toluene.

The acrylic adhesive in Table I was prepared in the same manner as Example #1, but using a 50:50 blend (based on solids) of Ashland A-1081 and A-1060 for the base adhesive.

The rubber-resin adhesive in Table I was prepared in the same manner as Example #1, but using a commercial hot melt adhesive P-1700 from Nicolmelt dissolved in toluene.

The silicone adhesive in Table I was prepared in the same way as Example #1, but using General Electric's PSA-6574 crosslinked with 2.0% of Akzo Chemical's CADOX TDP on solids.

By way of further explanation, Ashland A-1081 is a thermoplastic acrylic solution polymer having pressure sensitive tack. The solution viscosity ranges from 100–180 Stokes at 25° C., with the solids content ranging from 44–46% in a 75:25 blend of ethyl acetate and toluene. Ashland A-1060 is a thermosetting acrylic solution polymer having a solution viscosity ranging from 30–60 Stokes at 25° C.. The solids content ranges from 39–41% in a 75:25 blend of acetone and toluene. Nicomelt P-1700 is a pressure-sensitive hot melt adhesive having a softening point of 219°–229° F., with an application temperature of 300°–330° F. General Electric PSA-6574 is a silicone pressure-sensitive solution polymer having a solids content of 55% in a solvent blend of toluene and naphtha. The solution viscosity ranges from 9000 to 30,000 centipoise. Akzo Cadox TDP is supplied as a 50% active 2,4-dichlorobenzoyl peroxide in dibutyl phthalate.

The test equipment used was designed, calibrated, and certified for testing according to AAMI (Association for the Advancement of Medical Instrumentation) Standards for Pregelled Disposable ECG Electrodes. The equipment included variable DC and AC power supplies with variable AC frequency control, providing the testing capability to evaluate electrical performance over a wide range of conditions as illustrated in FIGS. 1 to 4.

Table III shows the physical properties of the above four conductive PSA's subsequent to inclusion of the conductive carbon filler. Each was made with 10 percent by weight carbon loading. The adhesives were coated at 1.0 oz.yd$^2$ dry weight on paper release liner and laminated to 2 mil polyester film for physical testing.

TABLE I

| Adhesive Base | Before Aging | | | | After Aging | | | |
|---|---|---|---|---|---|---|---|---|
| | 5' Peel (oz) | 500 g Shear (min) | RB Tack (in) | Probe Tack (gr) | 5' Peel (oz) | 500 g Shear (min) | RB Tack (in) | Probe Tack (gr) |
| Polar | 28 pt | 5 st | F4 | 250 | 34 pt | >240 | F8 | 110 |
| Acrylic | 47 nt | 21 st | H4 | 95 | 27 nt | 200 st | H7 | 40 |
| Rubber-resin | 50 nt | >240 | Q4 | 160 | 45 nt | >240 | Q9 | 570 |

TABLE I-continued

| | Before Aging | | | | After Aging | | | |
|---|---|---|---|---|---|---|---|---|
| Adhesive Base | 5' Peel (oz) | 500 g Shear (min) | RB Tack (in) | Probe Tack (gr) | 5' Peel (oz) | 500 g Shear (min) | RB Tack (in) | Probe Tack (gr) |
| Silicone | 37 nt | 137 st | F2 | 115 | 27 nt | >240 | F3 | 40 |

BA = Before Age,
AA = After Age, and refers to oven aging for 24 hrs. @ 150° F. All adhesives had less than 10 ohms resistance. The increase in shear strength after age is typical for both the polar base and the acrylic base.
Test methods:
Peel, modified PSTC-1, 5 minute dwell
500 g Shear, PSTC-7
RB Tack, modified PSTC-6
Probe Tack, Polyken, 1 cm./sec, 1 second dwell With regard to the data of Table III, it has also been found that significantly higher peel and tack values can be achieved by casting thicker adhesive films without a significant reduction in electrical conductivity.

Polar adhesives yield higher conductivity than other bases formulated with conductive black. Generally, such adhesives exhibit at least one order of magnitude higher conductivity at equivalent loadings, resulting from the inherent conductivity of the base PSA.

Most base PSA's exhibit a resistance through a 1 mil thickness that is greater than 20 megohms and, typically much higher than this test limit of conventional multimeters. Acrylic, rubber, and silicone PSA's are expected to exhibit a resistance on the order of $10^8$ to $10^{15}$ ohms/square inch. The polar base PSA can be formulated to produce much lower electrical resistance (on the order of $10^4$ to $10^8$ ohms/square inch) without the use of carbon or other conductive fillers. As a result, transparent films of electrically conductive PSA's have been produced with permanent as well as removable performance properties.

Suitable conductive polar base PSA's may be produced, for example, by combining a graftable polymer backbone such as maleic anhydride-alkyl vinyl ether copolymer with polyethylene oxide polymer surfactants. The result is a partially esterified tackifiable polymer having a high degree of polarity, which is conducive to good conductivity by virtue of the combined properties of polarity and mobility. The balance of electrical and physical properties can be varied over a wide range simply by adjusting the amount and type of surfactant.

The conductivity of the system may be optimized by selecting the highest HLB surfactant within the limits of the melting point of the surfactant which affords qood molecular mobility. For example, mobility, and therefore conductivity is sacrificed as the melt point of the surfactant approaches ambient, or normal use temperature, wherein the physical state is that of a solid.

EXAMPLE 2

A permanent-type pressure sensitive adhesive is made by adding 75 grams of a nonyl-phenol polyethylene-oxy ethanol surfactant such as GAF's Igepal Co-630 to a solution composed of 30 grams of the hydrolyzed form of an ethyl vinyl ether-maleic anhydride copolymer in 250 grams of solvent consisting of a 4 to 1 ratio of acetone to water. The mixture is allowed to react at 140° F. for 4 hrs. The product of the reaction is a partial ester of the polymer and surfactant which serves as a customized polymer for tackification with an excess of the same (or similar) surfactant.

Thin film draw downs of the polar base adhesive at 1.0 oz/yd² dry coat weight exhibit an electrical resistance of less than $10^6$ ohms through the adhesive film as well as a surface resistivity sufficient to draw away static charges. This electrical performance is well suited for applications requiring dissipation of static electricity while minimizing the propensity for arcing.

EXAMPLE 3

A removable-type PSA can be produced by substituting Air Products Surfynol 485 as the surfactant. The principle difference in performance is the peel strength which declines from 16-20 oz. per inch width initially to about 1-5 oz. per inch width with time or heat.

To determine the commercial viability of the conductive PSA's described, the electrical performance of same was evaluated.

While the applied voltage used in determining AC impedance in the AAMI Standards for Pregelled ECG Disposable Electrodes is 12.48 volts, it was the AC frequency (10 hertz) that is given particular attention in the Standard. Consequently, the AC impedance over a wide range of AC frequencies was determined for the polar adhesive and, a prominent gel-tab (3M's Litman pads).

Figure 2:
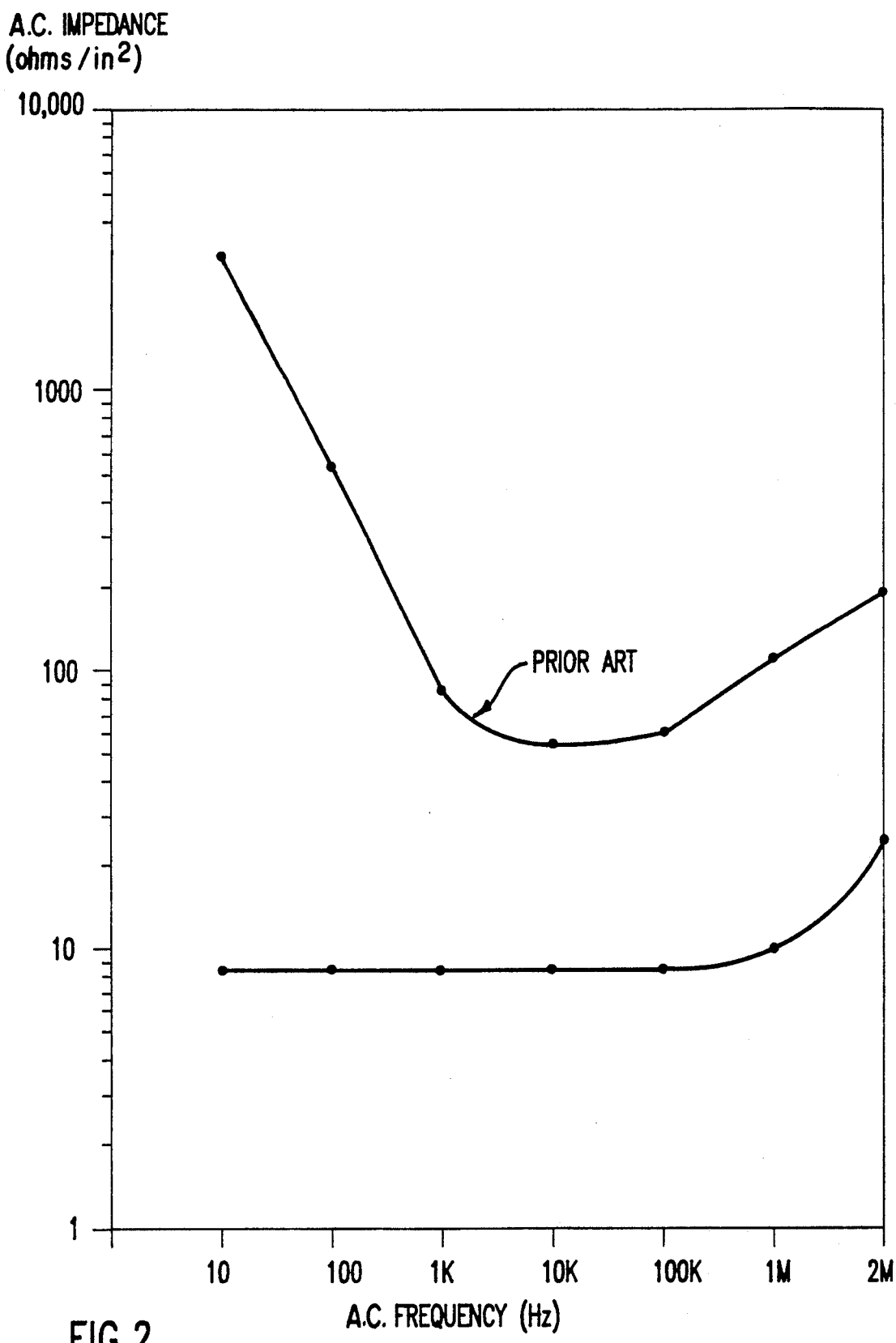
FIG. 2 is a graphical depiction of impedance vs. AC frequency for certain conductive PSA's.
Figure 3:
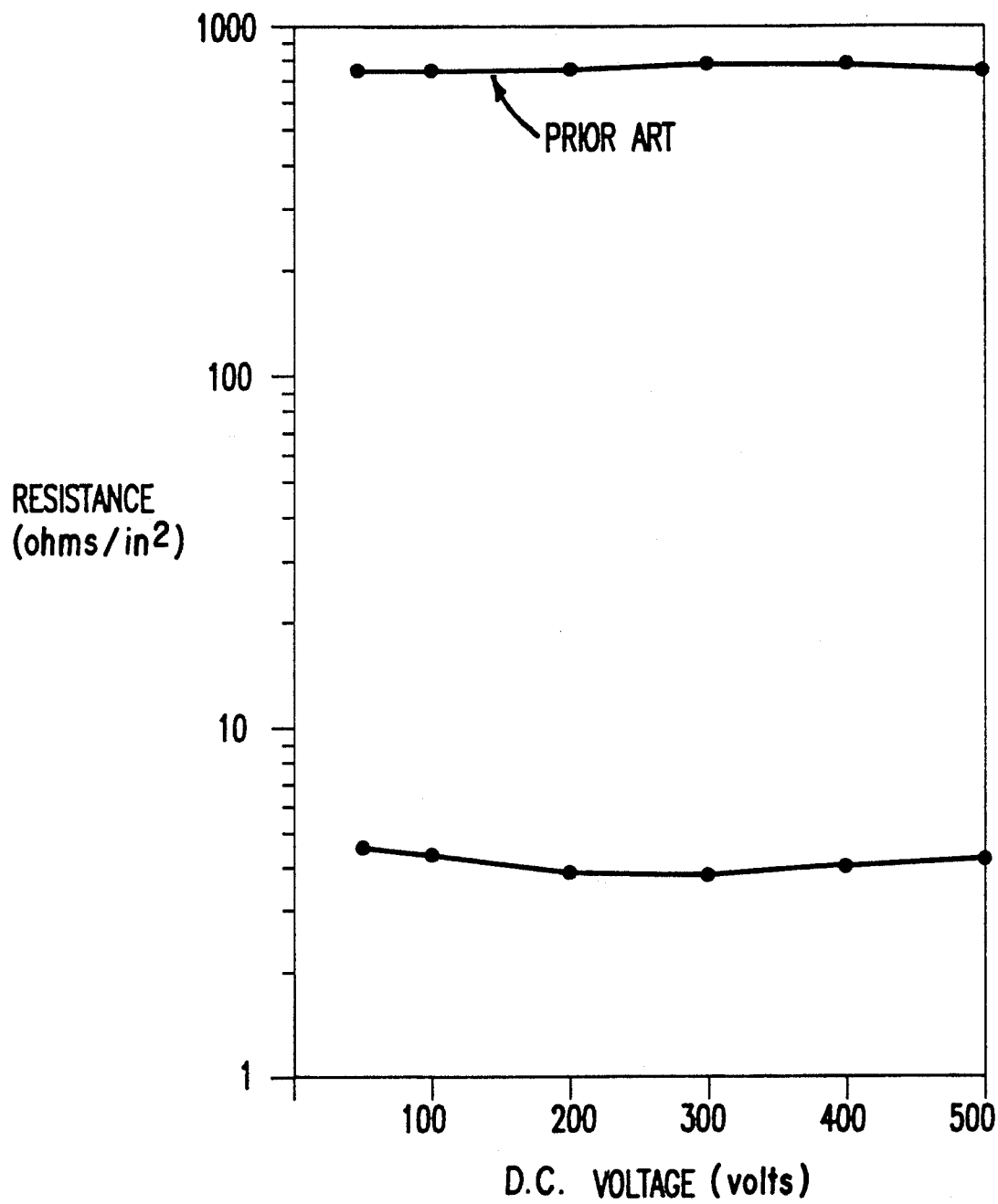
FIG. 3 is a graphical depiction of resistance vs. voltage for certain conductive PSA's.

In FIG. 2 a logarithmic scale was used for AC impedance so that data from both samples could be compared over the range of frequencies at which the samples were tested.

Commercially, electrical conductivity in disposable ECG electrodes is achieved through hydrogels. It is ironic that the poorest performance for a gel is at the frequency required for this type of application. Other hydrogels were tested using the AAMI Standard. None were found that consistently passed the AC impedance test out of the package.

In addition, they have the tendency to dry out as soon as the package is opened resulting in the loss of both electrical and physical properties within hours to days. The polar adhesive is neither a hydrogel nor is it water dependent. In addition, it easily meets all of the tests for ECG electrodes including AC Impedance, DC Offset, Offset Instability and Internal Noise, Defibrillation Overload Recovery, AC Impedance after Defibrillation, and Bias Current Tolerance.

Relative to industrial electronics application, the polar adhesive was evaluated in comparison with a commercially-promoted 2 mil transfer film (Coating Sciences U-141) for DC resistance, through the film and over a range of voltages. Although the material is characterized as a "conductive pressure sensitive", it is apparent from the sandpaper appearance that the product consists of conductive particles imbedded in an otherwise insulative adhesive film similar to the description in U.S. Pat. Nos. 3,475,213; 4,113,981; 4,606,962; and 4,729,809. Again, the resistance scale is logarithrimic to allow comparison of both samples in FIG. 3.

Figure 4:
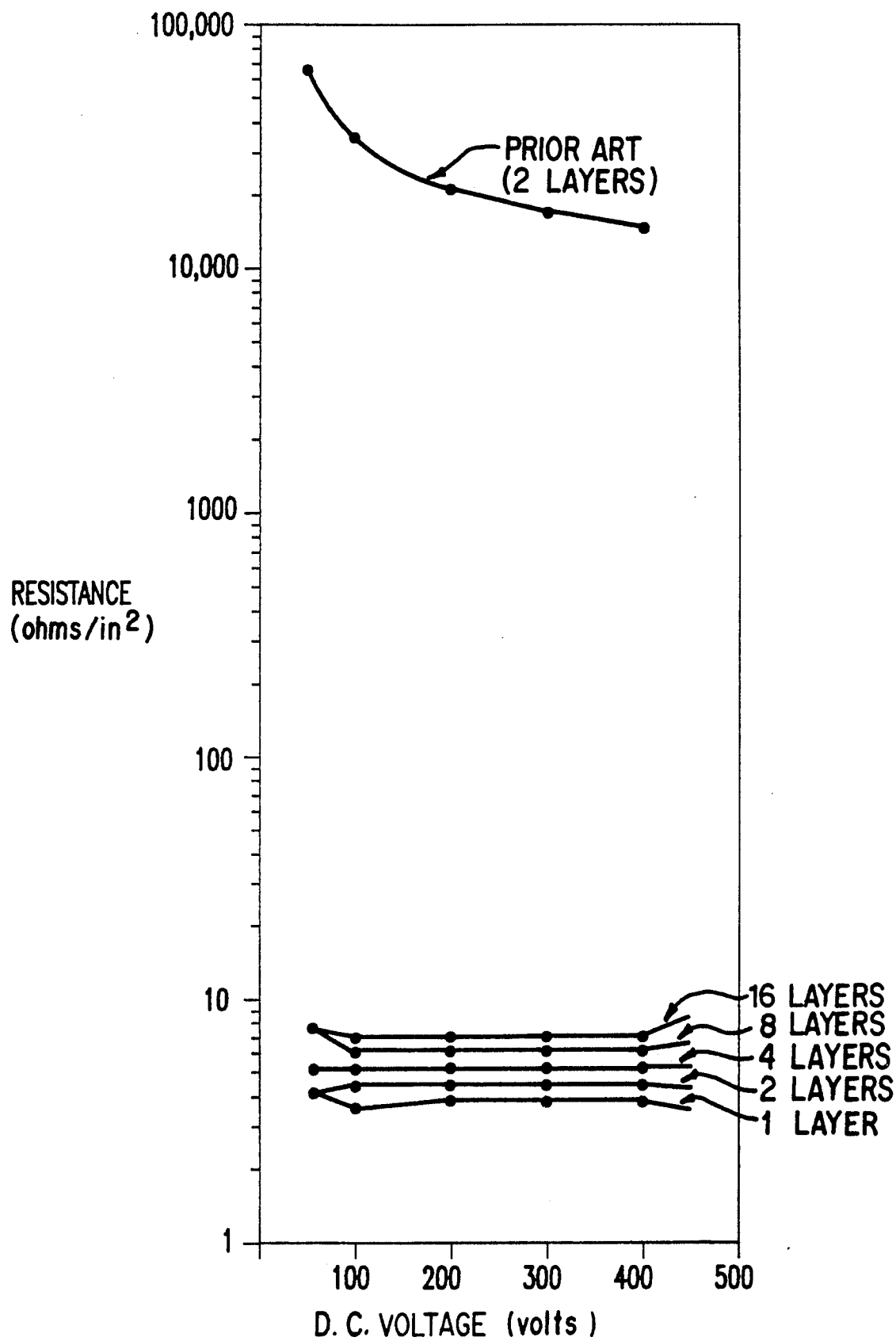
FIG. 4 is a graphical depiction of resistance vs. voltage for multilayer conductive PSA films.

In order to determine the homogeneity of conductivity, both of these adhesives were evaluated by testing resistance through multiple layers of the adhesive film over the same range of voltages. The commercial adhesive film had a significant increase in resistance through 2 layers. At 500 volts it increased from 749 ohms to 13,000 ohms. At 50 volts the resistance of two layers exceeded 60K ohms. The resistance of multiple layers of the polar adhesive is orders of magnitude less as shown in FIG. 4.

The graph shows that the level of conductivity for multiple layers of the 10% carbon polar adhesive is significantly better than would be predicted for even homogeneous electrical conductivity, since resistance would be expected to increase proportionally to distance (i.e., thickness). It is logical that the combination of polarity in the adhesive base with the conductive carbon produces a pressure sensitive having both electronic and ionic conductivity in addition to displaying good homogeneity. This multiple layer conductivity makes the adhesive well suited for multiple layer use applications as well as the practical splicing of conductive webs. In fact, while, for example, the resistance of a metallic film will increase in direct proportion to its thickness, it is surprising to note that the resistance of PSA films of the present invention increases to a lesser degree in relation to the thickness of the film.

Besides conductivity through the thickness of an adhesive film, the design of certain tape products may also require conductivity along the surface (or plane) of the tape. This requires low resistance over much greater distance than the thickness of an adhesive film. This can be accomplished by applying the adhesive to conductive films, foils, or inclusion of conductive fibers as discussed above.

To demonstrate that the adhesive composition of the present invention is well suited for such product design, a double-face tape was constructed by applying the adhesive of Example 1 to both sides of American Cyanamid's "Cycom" nickel plated graphite fiber matte having a basis weight of ¼ oz/yd$^2$.

To test the current-carrying capacity of this tape, a three quarter inch wide strip of the 5 mil tape was applied to a surface resistivity probe consisting of two brass electrodes, each having a 1 cm$^2$ surface area and separated by 1 cm. The circuit load consisted of household light bulbs. The circuit was plugged into an AC outlet (110-120v). With the tape suspended in air across the probe electrodes, the tape carried an AC current in excess of 2 amperes for several hours with no sign of electrical fatigue. The cross-sectional area of the tape would be roughly comparable to a 16 gauge wire.

EXAMPLE 4

In order to demonstrate the efficiency of the manner by which the conductive carbon black is admixed with the PSA, a comparison was conducted between the method employed in the present invention and a conventional "high shear" mixing method of the prior art (with the adhesive being heated to a temperature of 300° to 350° F.).

The PSA adhesive employed was the Nicolmelt rubber-based adhesive P1700 identified in Example 1 above. Due to the extremely high viscosities attained, 9.4 percent by weight of carbon was the maximum amount of carbon black that could be dispersed within the PSA by use of high shear mixing.

Samples were thus prepared that contained 5 and 9.4 percent by weight, respectively, of carbon black using the above adhesive using both the hiqh shear "hot melt" admixing method and the solvent-slurry admixing method of the present invention. Volume resistance (through the layer of adhesive over 1 square inch area) and surface resistance of 1 mil thick films (surface resistance between probes of 1 cm$^2$ each separated by one cm) were measured, with the results set forth in Table II III below:

TABLE II

| Sample Film | % Loading | Volume Resistance | Surface Resistance |
|---|---|---|---|
| A (Prior Art) | 5.0 | 564 Kilohms/in$^2$ | >20 ohms/in$^2$ |
| B (Prior Art) | 9.4 | 223 ohms/in$^2$ | 2.3 megohms/in$^2$ |
| C (Invention) | 5.0 | 42 ohms/in$^2$ | 474 kilohms/in$^2$ |
| D (Invention) | 9.4 | 0.87 ohms/in$^2$ | 6 kilohms/in$^2$ |

The results of Table II confirm that highly desirable electrical properties can be achieved by practice of the claimed invention. A conductive PSA film produced by the method of the present invention exhibits volume and surface resistances which are orders of magnitude less than those achieved by conductive PSA films produced by the high shear mixing method of the prior art.

Further, it is apparent that practical considerations limit the amount of carbon black that can be incorporated into a PSA composition by mere physical mixing of the carbon black and the PSA without prior modification of the physical properties of the PSA to render the PSA more amenable to the inclusion of the filler. By contrast, significantly greater amounts of carbon black can be incorporated into the PSA by the method of the claimed invention without significantly modifying the physical properties of the PSA while modifying the electrical properties of the PSA. More importantly, the amount of conductive carbon filler required to yield the desired electrical properties can be significantly reduced in comparison to prior art methods. For instance, the presence of 9.4 percent by weight of carbon in Sample B (prior art) reduced the volume resistance of the film to 223 ohms/in$^2$, while the presence of only 5.0 percent by weight of carbon in Sample C (invention) reduced the volume resistance to 42 ohms/in$^2$. Thus, half as much carbon enhanced the conductivity of the sample significantly.

Figure 5:
FIG. 5 is a photomicrograph (15,000 magnification) of a cross-section of a PSA film prepared according to the present invention.
Figure 6:
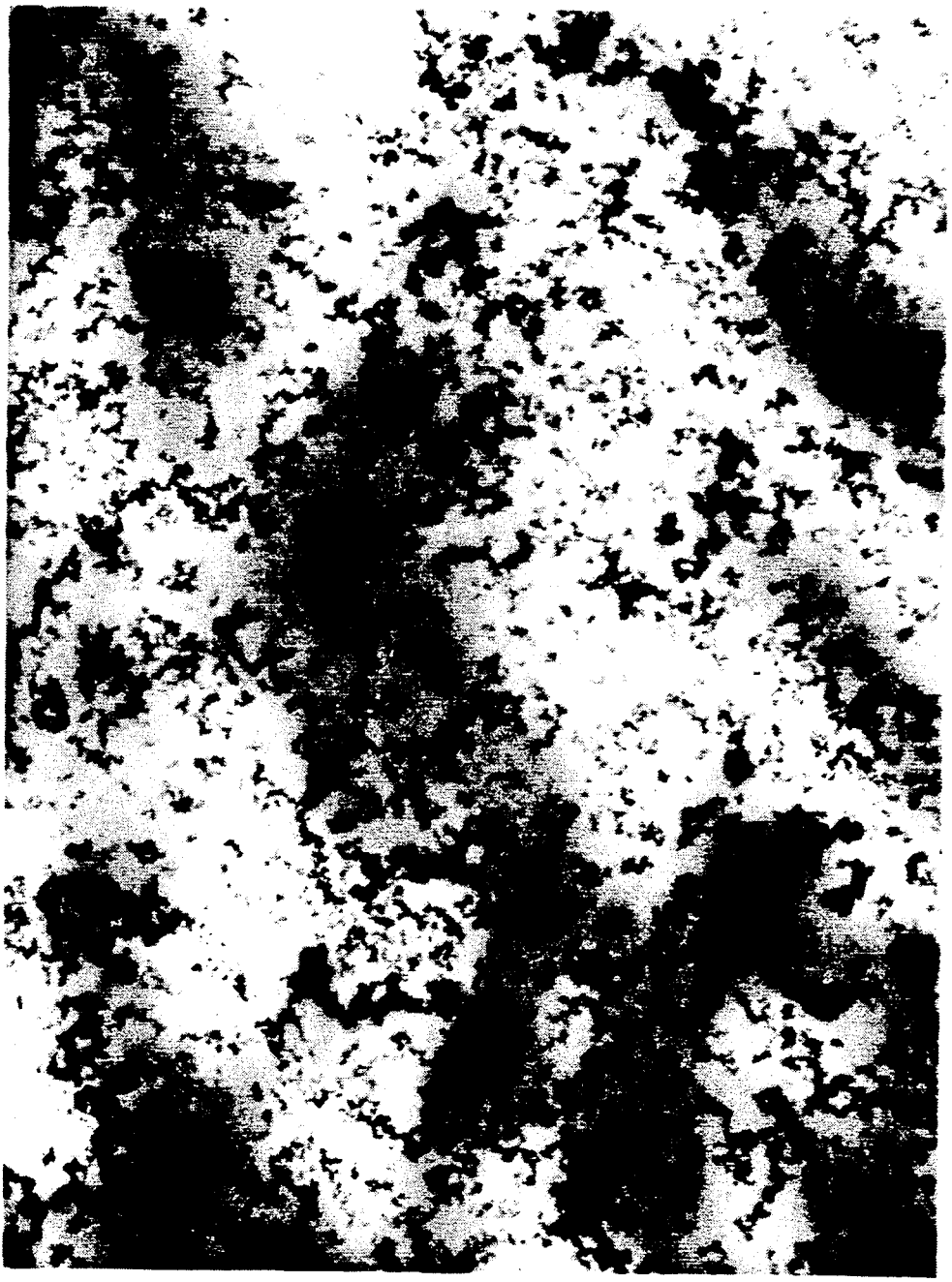
FIG. 6 is a photomicrograph (15,000 magnification) of a cross-section of a PSA film prepared according to the teachings of the prior art.

FIGS. 5 and 6 constitute Transmission Electron Micrographs depicting cross-sections of both conductive PSA films prepared according to the present invention (Sample D) and conductive PSA films prepared according to the prior art (Sample B) at a magnification of 15,000.

The figures clearly demonstrate the differences in the physical nature of the PSA which result depending upon the manner by which the carbon black is present in the respective sample, even though each sample contains the same amount of carbon.

While the carbon black particles appear to be homogeneously dispersed within the PSA of the comparative example (FIG. 6), it is surprising to note that such homogenous dispersion fails to result in desirable electrical properties.

By contrast, the carbon black is shown in FIg. 5 to be present in the form of channels of carbon clusters or localized areas of conductive carbon of higher density together with areas substantially devoid of conductive carbon which results in a high degree of conductivity throughout the adhesive layer.

It is quite unexpected that the use of high shear dispersion and the formation of a homogeneous admixture of the carbon particles within the PSA fails to achieve the desired results. In fact, it is determined that the optimization of dispersion of the carbon black within the composition, by means such as ball milling or other intense high shear, high speed dispersion techniques, is contrary to the intent of the present invention.

Instead, practice of the present invention results in the production of carbon particles clustered into microscopic channels forming a network of conductive pathways throughout the adhesive composition. While the dispersion of carbon particles is not homogenous, carbon structures are produced which are substantially homogeneous, with the attendant advantage that the electrical conductivity exhibited by the adhesive is similarly homogenous. As a result, PSA compositions can be produced in accordance with the present invention in which the required amount of carbon black to achieve the desired conductivity is as low as 10 percent by weight (dry weight) while still maintaining desirable PSA properties and an electrical resistance through a layer of the adhesive of less than 10 ohms per square inch, and preferably less than 50 milliohms per square inch.

In one embodiment, the PSA composition exhibits a peel strength of greater than 15 oz., while in another embodiment the PSA composition exhibits a peel strength of less than 24 oz. (as a removable PSA). Such compositions also preferably exhibit a resistance (as measured through the thickness of the PSA over a one square inch area) of less than 10 ohms/square inch.

In an embodiment where the PSA is employed in an antistatic environment, the PSA composition exhibits a resistance of from $10^4$ to $10^{12}$ ohms/square inch. In such an embodiment, a conductive black may generally but not necessarily be present in an amount of up to about 5 percent by weight (dry weight). PSA compositions may also be employed with advantage having a resistance ranging from 10 to less than $10^4$ ohms/in$^2$.

Another aspect of this invention is its unique suitability for making electrical connections. Here, again, the advantage stems from the essentially unaltered physical properties of commercially valuable pressure sensitive adhesives. The excellent wetting characteristic of a PSA applied to a surface afford a distinct advantage evident in testing the invention. To appreciate this advantage, the following description which includes testing details and considerations is necessary.

The electrical test equipment initially used in this testing did not include the sub-ohm resistance range (noting that the high conductivity achieved in the PSA's produced was better than expected).

In addition, the large number of resistance measurements would require frequent cleaning of the test electrode surfaces that would preclude the use of rigid and particularly oxidizing metals. In order to insure consistent repeatable measurements, close tolerances, particularly flatness, of the electrodes is critical for testing conventional thin film PSA's, typically 0.001" thick. Frequent cleaning of rigid materials such as copper, brass, gold, etc. would preclude consistent tolerances over time and, therefore, consistent contact area, and the resulting repeatability of measurements.

Consequently, the type of test electrodes selected consisted of pairs of 1"×1"×⅛" thick steel blocks having a thick (approximately ¼") layer of conductive silicone rubber for the contact surface, and their respective wire leads for connection to the readout device. The conductive silicone contact surface is non-oxidizing and non-rigid providing added insurance of consistent contact between surface pairs. The pair of test electrodes was checked frequently for consistent resistance (7.4 ohms) in a face to face calibration procedure.

When low electrical resistance in PSA's was realized, a readout device (microhmeter) capable of sub-ohm resistance measurements was employed. Of particular value anticipated was a convenience feature consisting of a "relative" button and internal circuitry which allows for a procedure where the internal resistance of the test apparatus such as the test electrodes could be "zero'd" allowing for the direct resistance reading of a sample.

Initially, using this method to measure resistance through a nominal 1 mil thickness of the adhesive described in example #1, three negative resistance readings were obtained. Now, in order to get negative values, the resistance of the sample and the electrode assembly would have to be lower than the resistance of the electrode assembly without the sample.

Surprisingly this is not particularly difficult to believe when the excellent surface wetting characteristics of PSA's are taken into account. This results in very intimate surface contact compared with other types of materials.

In order to be convinced that better electrical contact was in fact the explanation, the same test was run on three more samples, without the relative function. In this procedure the resistance of the electrodes is subtracted from the total resistance measurement. The direct readings were 7.45 ohms, 6.98 ohms, and 6.8 ohms. The resistance of the electrode assembly alone was 7.40 ohms. Therefore, sample resistances are 0.05 ohms, and two more negative values.

The direct readings support the belief that there is no malfunction or short circuit. It should also be noted that other highly conductive materials such as copper foil, stainless steel, etc. were also tested resulting in expectedly low resistance but never negative resistance.

It is apparent that the average resistance of this 10% carbon PSA is something less than 0.05 ohms (less than 50 milliohms). It appears therefore that the electrical contact between electrodes, is enhanced by the connecting layer of the conductive PSA, where the resistance of the electrode assembly includes a constant but less than intimate electrical contact at the interface. This exercise was repeated several times with different PSA formulations demonstrating that the electrically conductive PSA's disclosed herein are ideally suited for making electrical connections.

What is claimed is:
1. A method for the production of an electrically conductive pressure snesitive adhesive composition comprised of a pressure sensitive adhesive and a conductive carbon black dispersed in said adhesive, said method comprising the steps of:

forming a slurry of said conductive carbon black in an organic solvent compatible with said adhesive in the absence of high shear while preserving the ability of the carbon black to orient into chains of particles while achieving uniform wetting of said conductive carbon black by said solvent resulting in the formation of a homogeneous slurry of said conductive carbon black and said organic solvent, combining (1) said organic solvent-carbon black slurry with (2) a dispersion of said pressure sensitive adhesive in an organic solvent for said adhesive to form a homogeneous admixture of components (1) and (2) comprised of said conductive carbon black, each said organic solvent and said adhesive, and separating each said organic solvent from said admixture to yield a conductive pressure sensitive adhesive, said carbon black being present in said admixture in an amount such that said carbon black is present in said resulting pressure sensitive adhesive in an amount greater than 0 and less than 20 percent by weight based on the dry weight of the adhesive.

2. The method of claim 1 wherein said pressure sensitive adhesive is selected from the group consisting of a rubber-resin mixture, an acrylic adhesive and silicone adhesive.

3. The method of claim 1 wherein said slurry of said solvent and said carbon black is formed under stirring.

4. The method of claim 3 wherein said slurry is stirred for a time sufficient for the viscosity of said slurry to increase subsequent to admixture of all said carbon black with said solvent.

5. The method of claim 1 wherein said carbon black is present in an amount greater than 0 and less than 5 percent by weight, based on the dry weight of the adhesive composition.

6. The method of claim 1 wherein said organic solvent is selected from the group consisting of methyl ethyl ketone, toluene, acetone and ethyl acetate.

7. The method of claim 1 wherein the weight ratio of organic solvent to carbon black in said component (1) ranges from about 10:1 to about 100:1.

8. The method of claim 1 wherein said pressure sensitive adhesive is a polar adhesive.

* * * * *

UNITED STATES PATENT AND TRADEMARK OFFICE
CERTIFICATE OF CORRECTION

PATENT NO. : 5,082,595

DATED : January 21, 1992

INVENTOR(S) : RICHARD T. GLACKIN

It is certified that error appears in the above-identified patent and that said Letters Patent is hereby corrected as shown below:

Column 8, line 49, "Table III" should read --Table I--.

Column 9, line 15, "Table III" should read --Table I--.

Column 12, lines 11 and 12, "Table II III" should read --Table II--;

Column 12, Table II, line 16, "$>$20 ohms/in$^2$" should read --720 megohms--;

line 17, "2.3 megohms/in$^2$" should read --2.3 megohms--;

line 18, "474 kilohms/in$^2$" should read --474 kilohms--;

line 19, "6 kilohms/in$^2$" should read --6 kilohms--.

Col.14, Claim 1, line 2 of the claim, "snesitive" should read --sensitive--.

Signed and Sealed this

Twentieth Day of April, 1993

Attest:

MICHAEL K. KIRK

*Attesting Officer*   *Acting Commissioner of Patents and Trademarks*